(12) United States Patent
Hajimiri et al.

(10) Patent No.: US 6,940,355 B2
(45) Date of Patent: Sep. 6, 2005

(54) CIRCULAR GEOMETRY OSCILLATORS

(75) Inventors: Seyed-Ali Hajimiri, Pasadena, CA (US); Roberto Aparicio Joo, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 106 days.

(21) Appl. No.: 10/687,679

(22) Filed: Oct. 17, 2003

(65) Prior Publication Data

US 2004/0124931 A1 Jul. 1, 2004

Related U.S. Application Data

(60) Provisional application No. 60/419,607, filed on Oct. 18, 2002.

(51) Int. Cl.[7] ............................................. H03B 27/00
(52) U.S. Cl. ........................................... 331/2; 327/46
(58) Field of Search .............................. 331/2, 46, 48, 331/50, 117 R, 117 FE, 117 D

(56) References Cited

U.S. PATENT DOCUMENTS

| | | | |
|---|---|---|---|
| 4,694,261 A | 9/1987 | Ewen et al. | 331/57 |
| 6,246,294 B1 | 6/2001 | Gai | 331/57 |
| 6,268,778 B1 | 7/2001 | Mucke et al. | 331/117 R |
| 6,552,621 B2 * | 4/2003 | Northam | 331/108 R |
| 6,759,915 B2 * | 7/2004 | Akatsuka | 331/179 |
| 2002/0135422 A1 | 9/2002 | Aoki et al. | 330/276 |

FOREIGN PATENT DOCUMENTS

| | | |
|---|---|---|
| DE | 100 05 597 A1 | 10/2000 |
| WO | WO 02/31967 A2 | 4/2002 |

OTHER PUBLICATIONS

Search Report for PCT/US03/33126 Dated May 18, 2004 in co–pending PCT filing of U.S. application filed herewith.
Aparacio, et al., "A Noise–Shifting Differential Colpitts VCO", IEEE Journal of Solid–State Circuits, vol. 37, No. 12, Dec., 2002, pp. 1728–1736.
Wu, et al., "Silicon–Based Distributed Voltage–Controlled Oscillators", Journal of Solid–State Circuits, vol. 36, No. 3, Mar., 2001, pp. 493–502.

* cited by examiner

*Primary Examiner*—Linh My Nguyen
(74) *Attorney, Agent, or Firm*—Christopher J. Rourk; Godwin Gruber LLP

(57) ABSTRACT

An integrated voltage controlled oscillator is provided. The integrated voltage controlled oscillator includes a first slab inductor having two ends and a second slab inductor having two ends. A first oscillator core is connected to a first end of the first slab inductor and a second end of the second slab inductor, and a second oscillator core is connected to a second end of the first slab inductor and a first end of the second slab inductor. In this manner, the low-loss slab inductors provide the oscillator tank inductance.

30 Claims, 9 Drawing Sheets

← 400

← 400

← 500

← 500

| Technology | SiGe IBM 7HP | SiGe IBM 7HP |
|---|---|---|
| Miminum Channel Length | 0.18 ¦m | 0.18 ¦m |
| Output Frequency | 5.33 GHz | 5.36 GHz |
| Frequency Tuning | -- | 8.3% |
| Output Power | 1 dBm | 1 dBm |
| $V_{DD}$ | 1.4 V | 1.8 V |
| $I_{bias}$ | 10 mA | 12 mA |
| Phase Noise at 10 MHz Offset | -147.3 dBc/Hz | -142.2 dBc/Hz |

Voltage to Frequency
Transfer Function

Phase noise @600KHz offset
$V_{dd}$=1.8V and $I_{bias}$=12mA

US 6,940,355 B2

CIRCULAR GEOMETRY OSCILLATORS

PRIORITY DATA

This application claims prior to U.S. provisional application No. 60/419,607, filed Oct. 18, 2002, entitled "Distributed Active Transformer Based Oscillators," which is hereby incorporated by reference for all purposes.

FIELD OF THE INVENTION

The present invention pertains to the field of oscillators, and in particular to integrated, high frequency voltage controlled oscillators (VCOs).

BACKGROUND OF THE INVENTION

Integrated VCOs are essential building blocks in phase locked loops, clock recovery circuits, frequency synthesizers, and other circuits used in communication systems. While attempts have been made to fabricate a high frequency VCO on a lossy substrate, such as silicon or silicon germanium, the low quality of inductors used to implement the oscillator tank has limited the phase noise performance of such oscillators. The main cause of low quality in the oscillator tank inductor is the conductive lossy substrate, as a long metal line in a conventional spiral conductor made on the same substrate will be lossy in terms of the power dissipated by the inductor. If the metal line is wide, the capacitive coupling between the metal and the substrate will drain part of the current to the substrate, absorbing a significant portion of the signal power being transmitted across the metal line. On the other hand, if the metal line is made narrow enough to reduce the previous effect to a small level, the overall metal resistance will increase significantly, once more absorbing a significant part of the signal power.

SUMMARY OF THE INVENTION

In accordance with the present invention, a circular geometry oscillator is provided that overcomes known problems with high frequency oscillators.

In particular, a circular geometry oscillator is provided that uses slab inductors to reduce signal losses and improve phase noise performance.

In accordance with an exemplary embodiment of the present invention, an integrated VCO is provided. The integrated VCO includes a first slab inductor having two ends and a second slab inductor having two ends. A first oscillator core is connected to a first end of the first slab inductor and a second end of the second slab inductor, and a second oscillator core is connected to a second end of the first slab inductor and a first end of the second slab inductor. In this manner, the low-loss slab inductors provide the oscillator tank inductance.

The present invention provides many important technical advantages. One important technical advantage of the present invention is an integrated, high-frequency VCO that uses low-loss, high-Q slab inductors to provide the oscillator tank inductance, which reduces signal loss and improves phase noise performance.

Those skilled in the art will further appreciate the advantages and superior features of the invention together with other important aspects thereof on reading the detailed description that follows in conjunction with the drawings.

DETAILED DESCRIPTION OF PREFERRED EMBODIMENTS

Figure 1A:
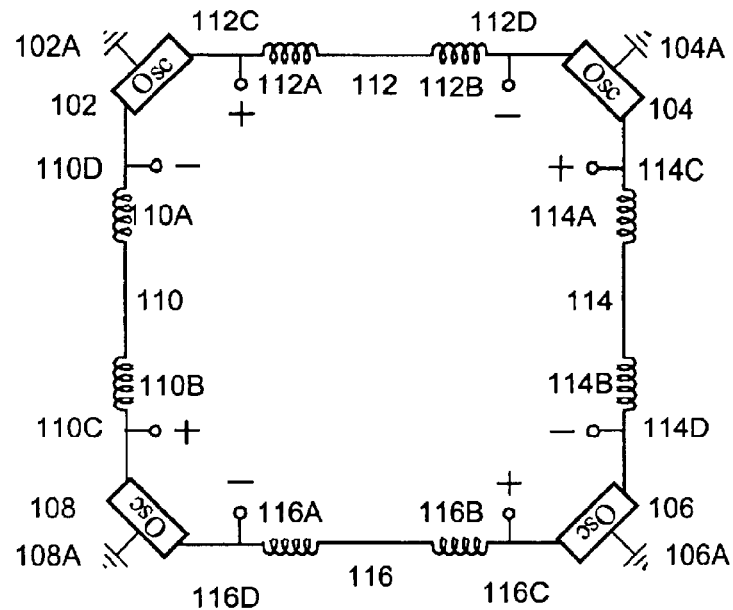
FIGS. 1A and 1B are schematic and layout diagrams, respectively, of a circular geometry VCO in accordance with an exemplary embodiment of the present invention.

In the description that follows, like parts are marked throughout the specification and drawings with the same reference numerals, respectively. The drawing figures might not be to scale, and certain components can be shown in generalized or schematic form and identified by commercial designations in the interest of clarity and conciseness.

Figure 1B:
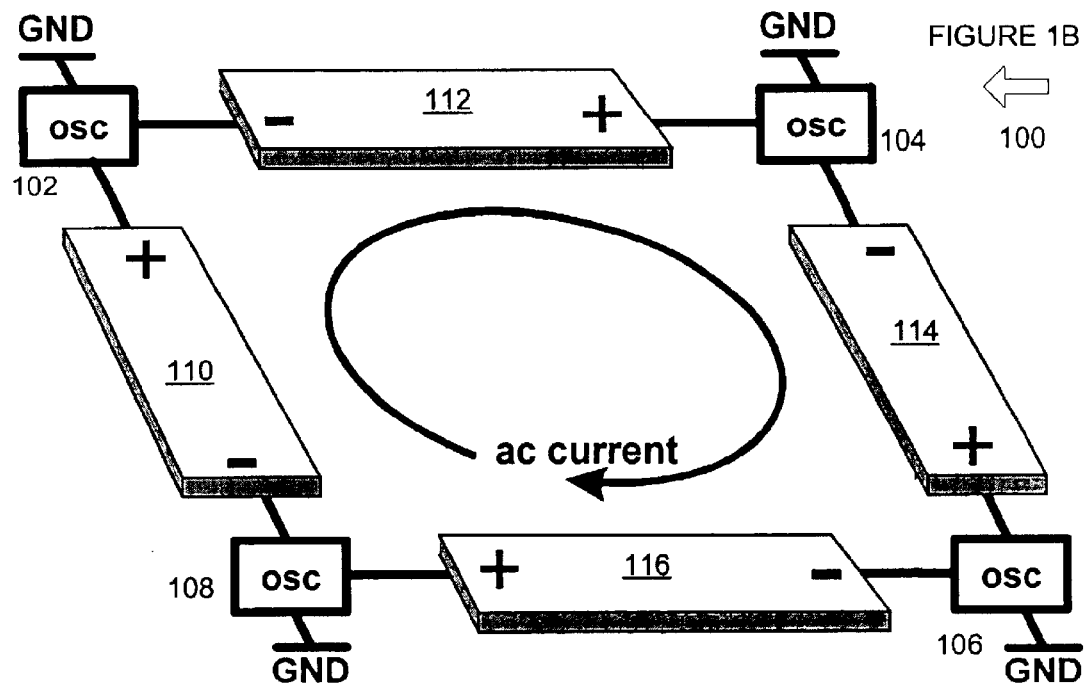

FIGS. 1A and 1B are schematic and layout diagrams, respectively, of a circular geometry VCO 100 in accordance with an exemplary embodiment of the present invention. VCO 100 can be implemented using slab inductors to provide a significantly higher quality factor "Q" as well as multiple oscillator cores to improve phase noise performance.

VCO 100 includes oscillators 102, 104, 106, and 108, which are connected to each other via slab inductors 110, 112, 114, and 116. As used herein, the term "connect," and its cognate terms such as "connects" and connected," can include a connection though a conductor or conducting element, a connection through other associated systems or components, or other suitable connections. As shown, each oscillator 102, 104, 106, and 108, is connected to ground via an associated ground connection 102A, 104A, 106A, and 108A, respectively. Likewise, each slab inductor 110, 112, 114, and 116 has associated inductances modeled as inductors 112A and 112B, 114A and 114B, 116A and 116B, and 118A and 118B, respectively.

Oscillators 102, 104, 106, and 108 can be implemented as NMOS-only cross-coupled oscillators, PMOS-only cross-coupled oscillators, complementary cross-coupled oscillators, noise shifting differential Colpitts oscillators, or other suitable oscillators. At the desired oscillation mode of operation, half of the oscillators operate in a given phase and the other half operate at the opposite phase. Virtual AC grounds and supplies may be created using adjacent opposite phase oscillators such that the supply and ground connections carry only DC current to avoid the capacitive coupling to the substrate at the supply and ground connections. Slab inductors 110, 112, 114, and 116 can be fabricated to be short and wide so as to provide lower loss and higher quality factor, Q, than conventional spiral inductors. Slab inductors 110, 112, 114, and 116 can be rectangular, can be curved, can include one or two turns (such as an "L" shape or a "U" shape), or can have other suitable configurations.

FIG. 1B shows an exemplary physical embodiment of VCO 100 with slab inductors 110, 112, 114, and 116 coupled to oscillators 102, 104, 106, and 108. In this exemplary embodiment, short and wide slab inductors are used to provide the tank inductance for each oscillator, so as to provide higher quality factor, Q, and lower power loss.

In operation, VCO 100 uses short and wide slab inductors to provide the tank inductance for each of four oscillators that are operating in opposite phases to those oscillators adjacent to them. Suitable oscillator cores can be used to provide the oscillators 102, 104, 106, and 108, so as to provide for the voltage level of a given application, phase noise performance requirements, or other design constraints. In this manner, high frequency voltage controlled oscillators can be provided on a lossy substrate, because the higher quality inductors help to improve phase noise performance of the oscillators. Likewise, connection of the oscillators in a circular configuration forms a virtual AC ground in each corner, and allows the outputs of several oscillators to be combined to decrease their sensitivity to perturbations and thus enhances their phase noise performance.

Figure 2:
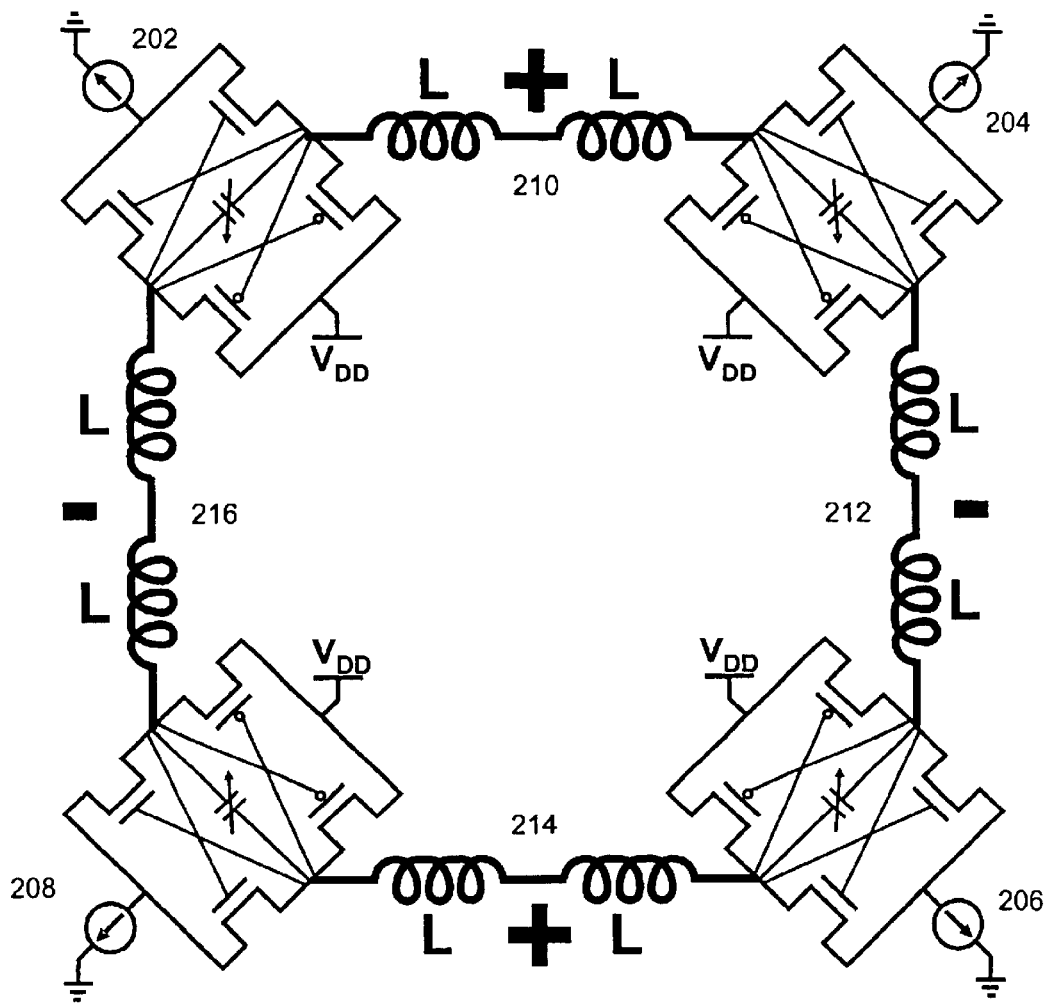
FIG. 2 is a diagram of an exemplary circular geometry VCO with exemplary complementary oscillator circuits.

FIG. 2 is a diagram of an exemplary circular geometry VCO 200 with exemplary complementary oscillator circuits. VCO 200 includes complementary oscillators 202, 204, 206, and 208, each of which are shown receiving a voltage source $V_{DD}$ and having a regulated current source connected to ground. The slab inductors 210, 212, 214, and 216 that couple each of the oscillators 202, 204, 206, and 208 are driven such that a stable DC configuration is provided without center connections. From a DC standpoint, the configuration of the four oscillators appears as four latches connected in a loop. At the desired oscillation mode, the slab inductor center points are at a virtual ground. Thus, connecting them in DC would suppress undesired DC and parasitic modes of oscillation, while not affecting desired modes of oscillation.

Figure 3A:
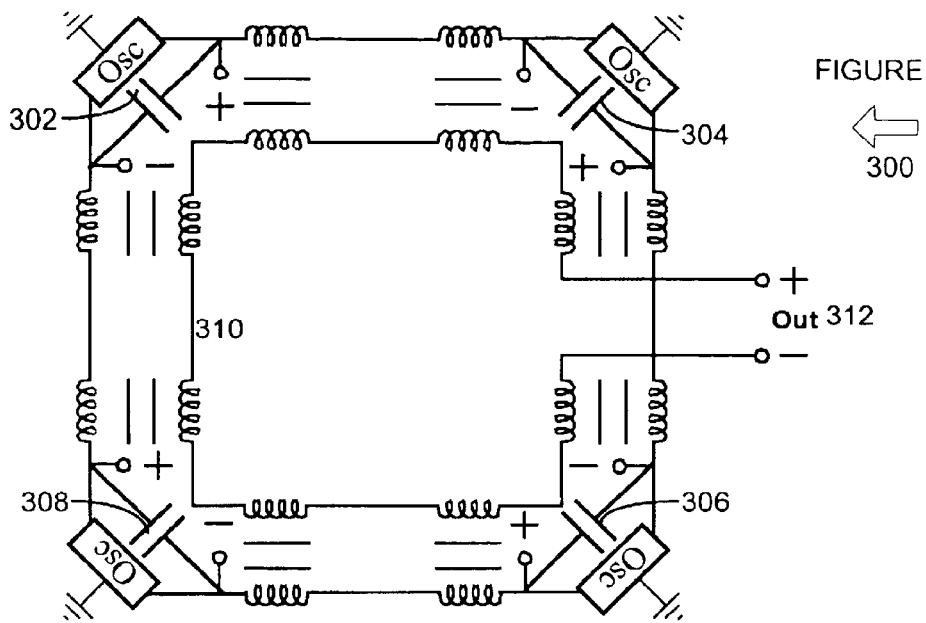
FIGS. 3A and 3B are schematic and layout diagrams, respectively, of a circular geometry VCO with tank capacitors in accordance with an exemplary embodiment of the present invention.
Figure 3B:
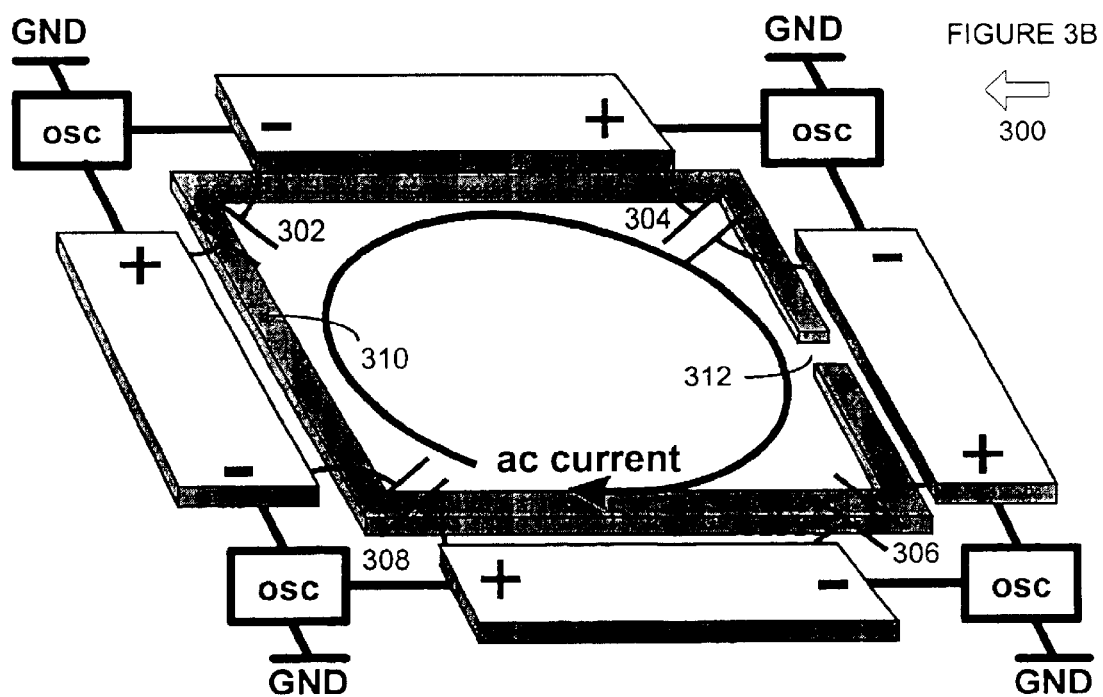

FIGS. 3A and 3B are schematic and layout diagrams, respectively, of a circular geometry VCO 300 with tank capacitors in accordance with an exemplary embodiment of the present invention. FIG. 3A demonstrates an exemplary circuit diagram that in addition to the circuit elements shown in FIG. 1A, includes tank capacitors 302, 304, 306, and 308. Each tank capacitor is placed in parallel with a corresponding oscillator 102, 104, 106, and 108, respectively, so as to provide the tank capacitor core for use in conjunction with the tank inductance. The capacitor tanks can be implemented using a voltage controlled capacitor thus enabling the frequency tuning capabilities to the oscillator. In a conventional oscillator circuit, this resonant capacitor can be connected between the drains or collectors of the cross coupled transistor pair. If this conventional connection is used, it is difficult to use very short and wide line slab inductors in the drain or collector due to their geometry, as the distance between the drains and collectors of the pair of cross connected transistors should be very small to avoid parasitic inductance.

In addition, coil 310 is provided with output 312 to allow the oscillator signal to be provided to an output. This configuration of coil 310 within the loop formed by slab inductors 110, 112, 114, and 116 forms a transformer with a 1:1 turn ratio. The primary winding of the 1:1 transformer is the output circuit of each of the individual oscillators, and the secondary winding conductors are connected in series with each other and the output. This transformer configuration can be used to provide output impedance matching, to allow balanced or unbalanced operations, to provide DC isolation and power combining of the oscillators for a single output, and to provide other useful functions. In addition, the combined power losses in a VCO using this configuration are lower than those from a VCO that uses conventional spiral transformers.

In operation, VCO 300 allows an oscillator signal to be extracted through the use of a pickup loop operating as a transformer secondary winding, and further provides for the addition of resonant capacitors for each pair of slab inductor terminals to be placed in parallel across a corresponding oscillator.

Figure 4A:
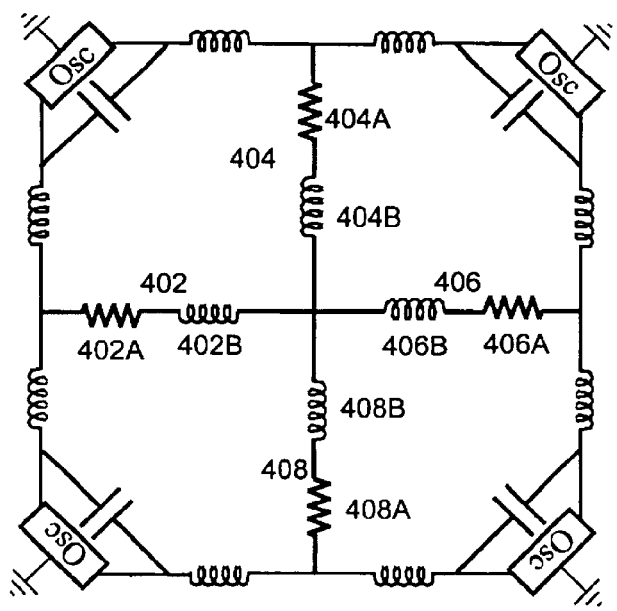
FIGS. 4A and 4B are schematic and layout diagrams, respectively, of a circular geometry VCO with cross-conductors in accordance with an exemplary embodiment of the present invention.
Figure 4B:
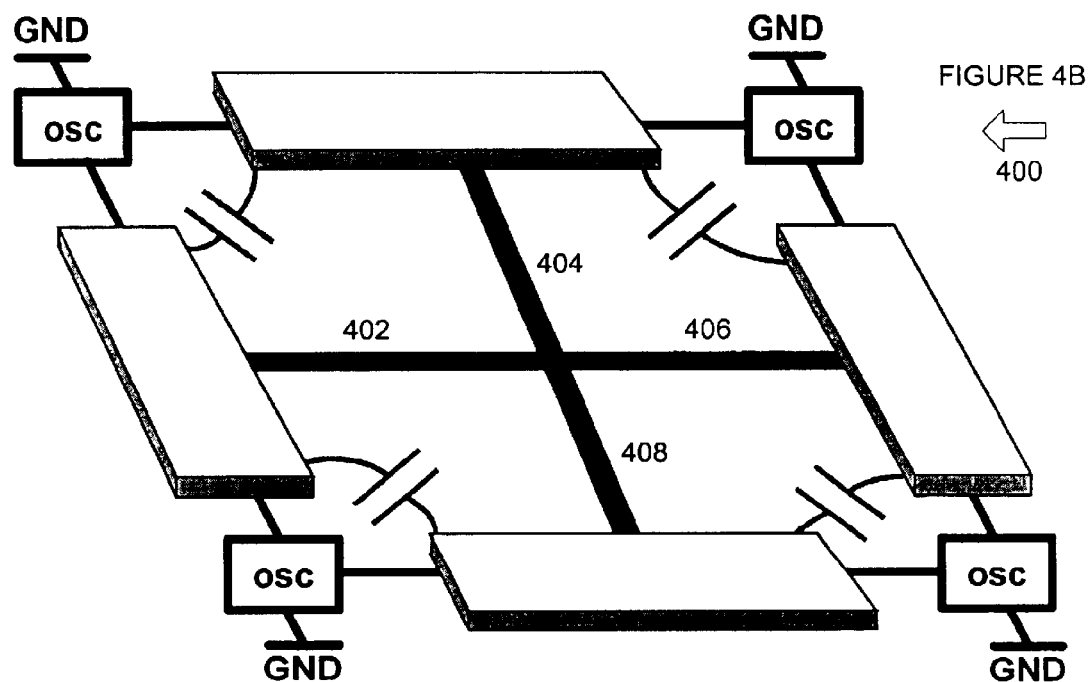

FIGS. 4A and 4B are schematic and layout diagrams, respectively, of a circular geometry VCO 400 with cross-conductors in accordance with an exemplary embodiment of the present invention. In addition to the circuit elements previously discussed in regards to VCOs 100 and 300, VCO 400 shows additional conductors 402, 404, 406, and 408, which are used to suppress undesired modes of operation.

As shown in FIG. 4A, each conductor includes associated resistances, such as resistance 402A for conductor 402, resistance 404A for conductor 404, resistance 406A for conductor 406, and resistance 408A for conductor 408. Likewise, an associated inductance for each conductor exists, such as inductance 402B for conductor 402, inductance 404B for conductor 404, inductance 406B for conductor 406, and inductance 408B for conductor 408. At a desired mode of oscillation, the slab inductor center points are at a virtual ground. Connecting them in DC suppresses undesired DC latch and parasitic modes of oscillation while not affecting the desired mode of operation. This is done in a symmetrical fashion by introducing cross conductors 402, 404, 406, and 408, which are connected to the slab inductor center point. This shorts the outputs of the oscillator cores at low frequencies and even harmonics, which helps to avoid DC latch. In addition, the cross connection loads the outputs of the oscillators with a small impedance, which decreases the startup gain of the parasitic oscillation modes.

Figure 5A:
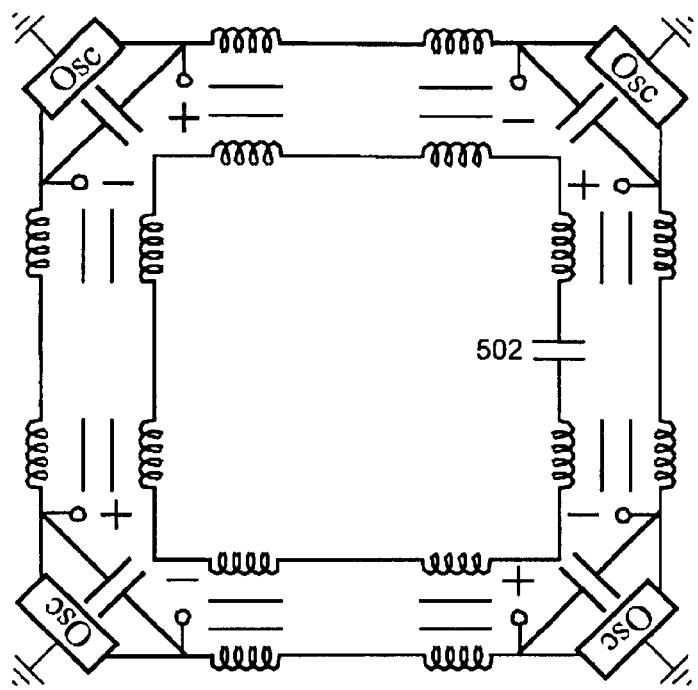
FIGS. 5A and 5B are schematic and layout diagrams, respectively, of a circular geometry VCO with two resonant tanks in accordance with an exemplary embodiment of the present invention.
Figure 5B:
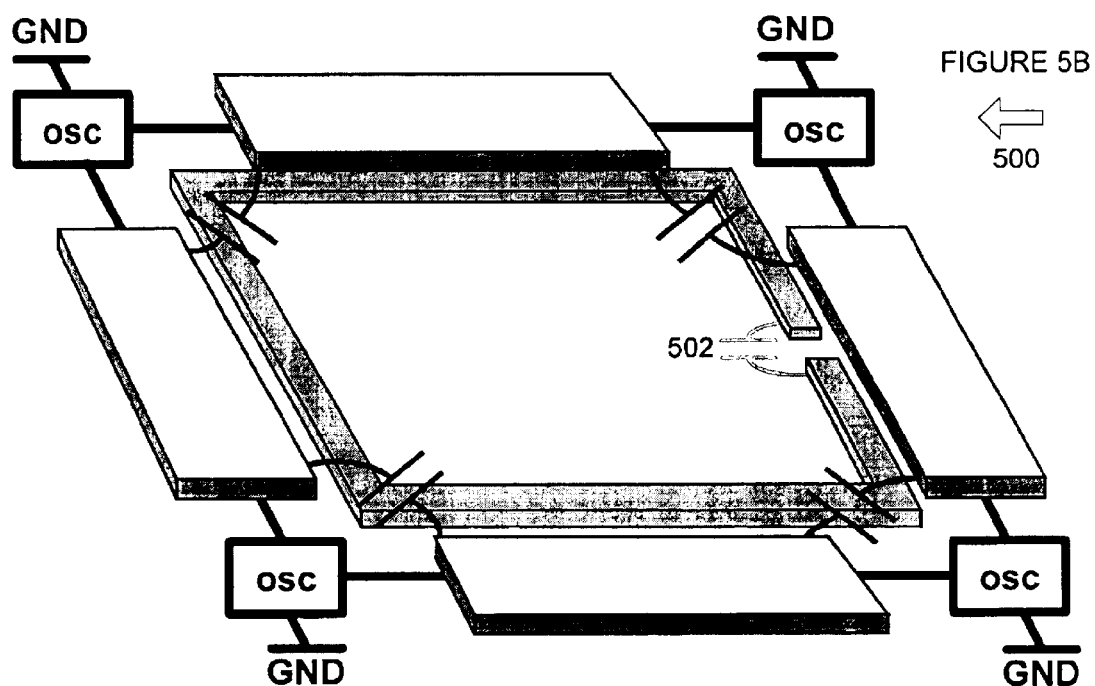

FIGS. 5A and 5B are schematic and layout diagrams, respectively, of a circular geometry VCO 500 with two resonant tanks in accordance with an exemplary embodiment of the present invention. In addition to the circuit elements previously discussed in regards to VCOs 100, 300 and 400, VCO 500 includes a capacitor 502 across the output of the secondary winding to provide two resonating tanks. Dual distributed resonating tanks can be used to boost the quality factor "Q" of the tank. Additional loops can likewise be provided inside and outside of the primary to provide additional resonating tanks, a pick up loop, or other suitable elements. While adding more resonating tanks will boost the quality factor "Q" of VCO 500, practical limitations may limit the number to two or three resonating tanks. The resonating capacitor can also be broken down to several equivalent capacitors in series to maintain symmetry, such as one for each inductance of VCO 500. The capacitors can also or alternatively be implemented as varactors to allow frequency tuning, the tuning can be achieved by the control voltage of the VCO, the tuning techniques can be combined to provide for a coarse and a fine tuning voltage, or other suitable techniques can be used.

Figures 6, 7:
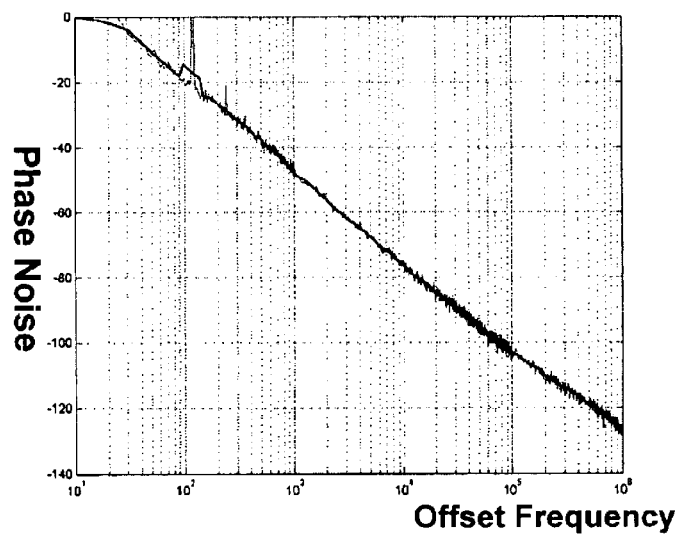
FIG. 6 is a table showing the performance of two fabricated prototypes of a circular geometry single frequency oscillator and VCO.
FIG. 7 is a diagram of phase noise versus offset frequency for the 5.33 GHz single frequency prototype circular geometry oscillator with characteristics shown in FIG. 6.

FIG. 6 is a table showing the performance of two fabricated prototypes of a circular geometry single frequency oscillator and VCO. The oscillators were implemented using 0.18·m CMOS transistors using a SiGe process. The single frequency oscillator has an oscillation frequency of 5.3 GHz, and the VCO has a center frequency of 5.36 GHz with 8% continuous frequency tuning. The output power for both prototype oscillators is 1 dBm, and the source voltage is 1.4 volts for the single frequency oscillator and 1.8 volts for the VCO. The bias current for the single frequency oscillator and the VCO is 10 and 12 milliamps, respectively, and the measured phase noise at 10 MHz offset was −147.3 and −142.2 dBc/Hz, respectively. The lower phase noise of the fixed frequency compared to the VCO is predominantly due to the poor quality factor of the varactors at higher frequencies.

For these prototypes, the oscillator topology chosen was the complementary cross coupled oscillator due to its higher oscillation amplitude and low voltage of operation. The oscillators were also optimized using linear programming.

FIG. 7 is a diagram of phase noise versus offset frequency for the 5.33 GHz single frequency prototype circular geometry distributed active transformer based oscillator with characteristics shown in FIG. 6. The phase noise decreases with an increase in offset frequency. It should be noted that the spectrum shown in FIG. 7 monotonically decreases. The phase noise performance of this oscillator is significantly improved as compared with to previously published phase noise results for fully integrated oscillators operating in the frequency range above 4 GHz.

Figure 8:
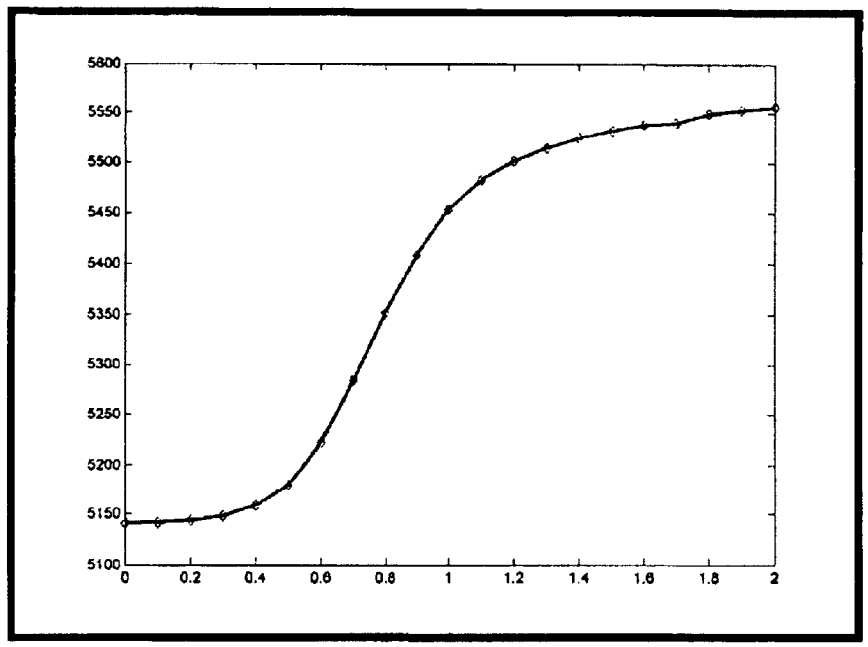
FIG. 8 shows the voltage to frequency transfer function of the prototype 5.36 GHz circular geometry VCO with characteristics shown in FIG. 6.

FIG. 8 shows the voltage to frequency transfer function of the prototype 5.36 GHz circular geometry VCO with characteristics shown in FIG. 6. It should be noted that the prototype oscillator has novel frequency tuning capabilities and a relatively linear voltage transfer function characteristic from 0.6 V. to 1.2 V.

Figure 9:
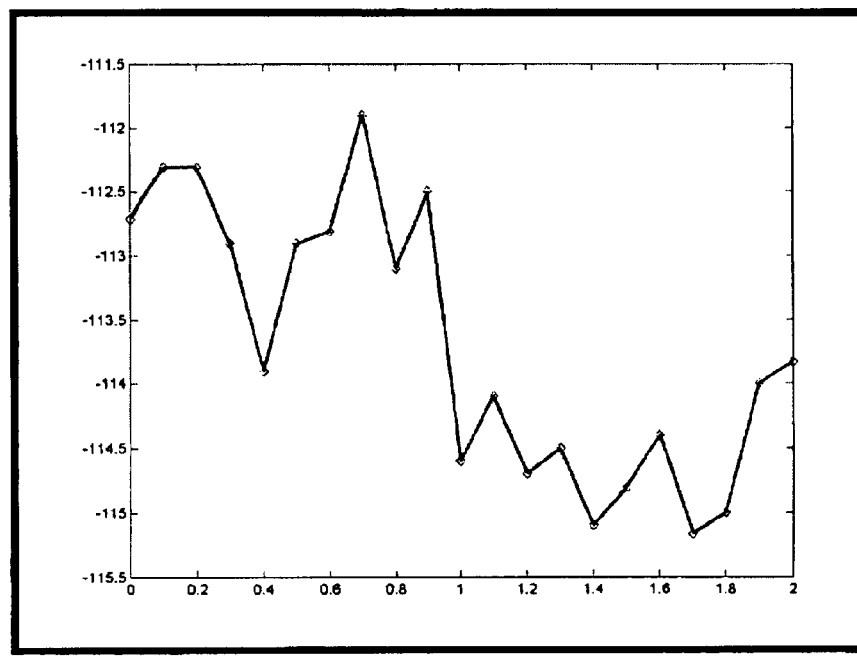
FIG. 9 shows measured phase noise at 600 kHz offset as a function of the control voltage for the prototype 5.36 GHz circular geometry VCO with characteristics shown in FIG. 6.

FIG. 9 shows measured phase noise at 600 kHz offset as a function of the control voltage for the prototype 5.36 GHz circular geometry distributed active transformer based VCO with characteristics shown in FIG. 6. It is noteworthy that the phase noise vs. control voltage for this prototype has a variation of +−1.5 dB which represents a notable improvement over prior art oscillators, in which phase noise is much worse for different frequency tuning conditions.

Figure 10:
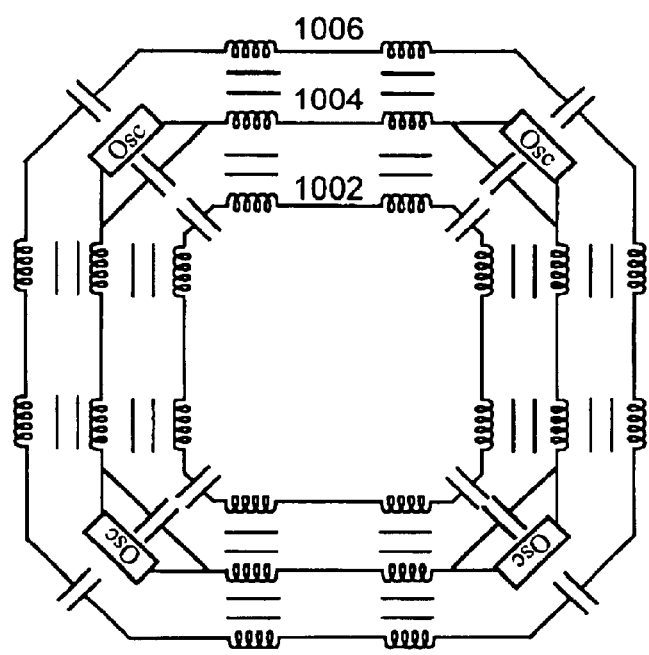
FIG. 10 is a circular geometry oscillator 1000 with three resonating tanks in accordance with an exemplary embodiment of the present invention.

FIG. 10 is a circular geometry oscillator 1000 with three resonating tanks in accordance with an exemplary embodiment of the present invention. Circular geometry oscillator 1000 includes circular geometry oscillator loop 1004 with inner resonating tank 1002 and outer resonating tank 1006. The resonating tanks 1002 and 1006 have distributed inductances and capacitances, and the capacitances can alternatively be replaced by varactors to provide additional frequency control. Likewise, a suitable number of capacitances can be used, an output can be provided for either or both resonating tanks, or other suitable features can be provided, such as those described herein.

Figure 11:
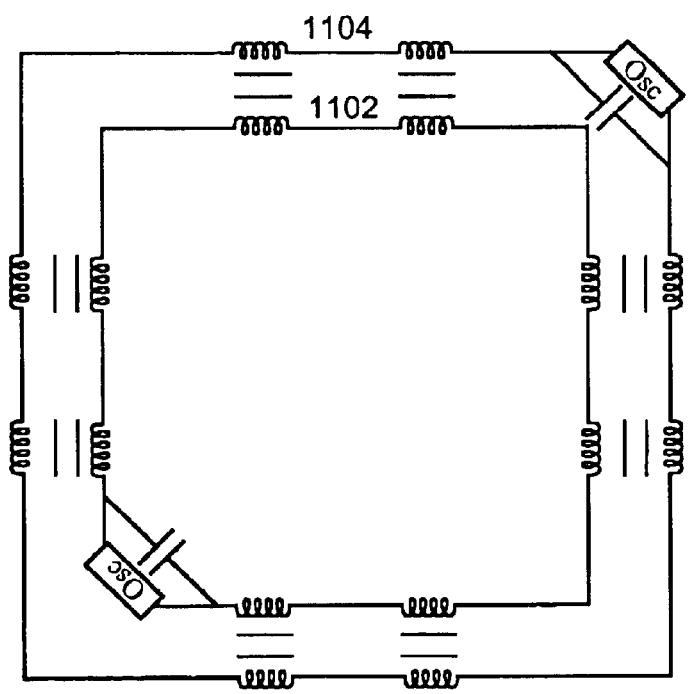
FIG. 11 is a diagram of coupled circular geometry oscillators 1100 in accordance with an exemplary embodiment of the present invention.

FIG. 11 is a diagram of coupled circular geometry oscillators 1100 in accordance with an exemplary embodiment of the present invention. Coupled circular geometry oscillators 1100 include circular geometry oscillator 1102 and circular geometry oscillator 1104, each with a single oscillator at opposite corners. A suitable number of corners, capacitors or varactors, coupled circular geometry oscillators, or other suitable features can be provided, such as those described herein. Coupled circular geometry oscillators can be used to improve phase noise performance, decrease the die area of the oscillators for a given inductance value, and to provide other advantages.

Figure 12:
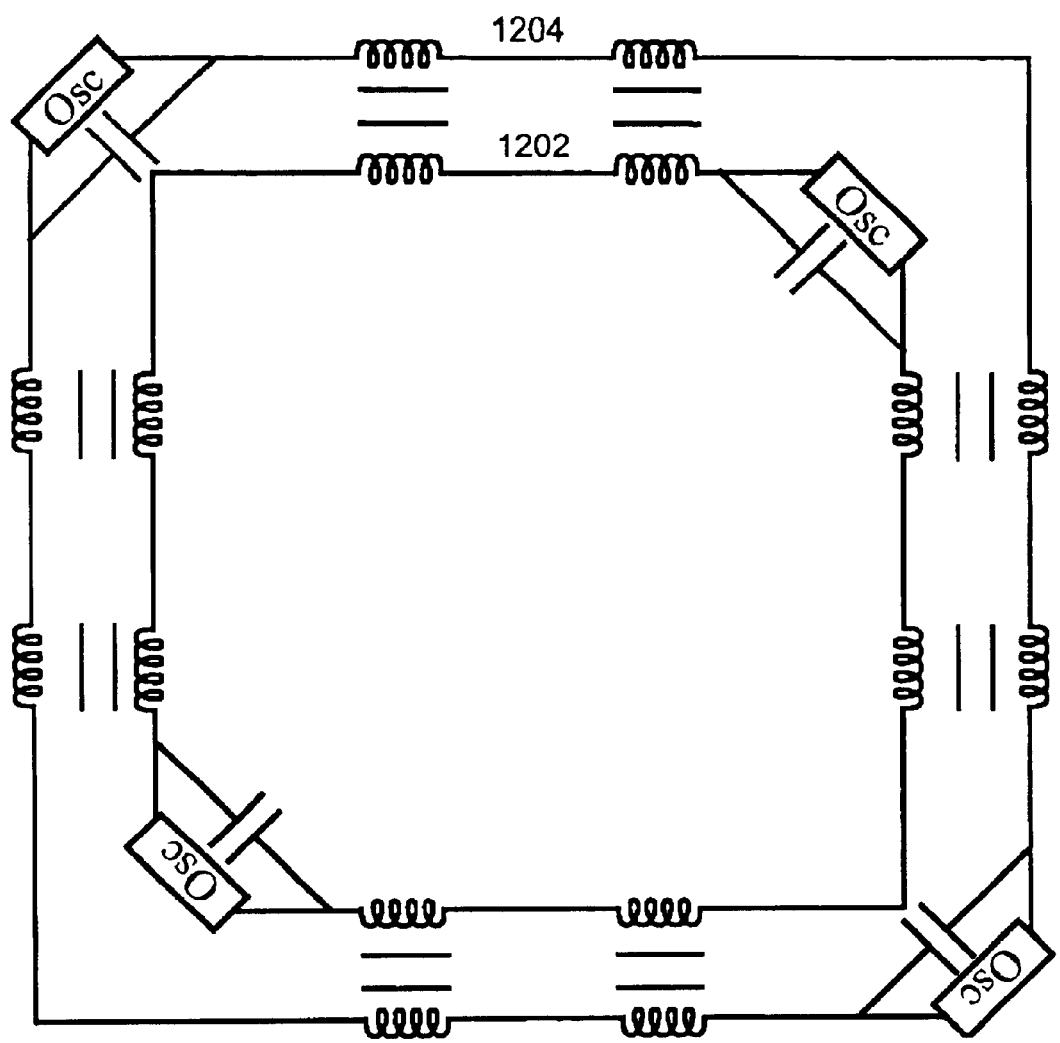
FIG. 12 is a diagram of coupled circular geometry oscillators 1200, each with dual oscillators, in accordance with an exemplary embodiment of the present invention.

FIG. 12 is a diagram of coupled circular geometry oscillators 1200, each with dual oscillators, in accordance with an exemplary embodiment of the present invention. In this exemplary embodiment, two corner oscillators are provided at each of circular geometry oscillators 1202 and 1204, although a suitable number of corner oscillators, coupled circular geometry oscillators, resonating tanks, capacitors or varactors, or other suitable features can be provided, such as those described herein.

Although exemplary embodiments of a system and method of the present invention have been described in detail herein, those skilled in the art will also recognize that various substitutions and modifications can be made to the systems and methods without departing from the scope and spirit of the appended claims.

What is claimed is:

1. An integrated voltage controlled oscillator comprising:
   a first slab inductor having two ends;
   a second slab inductor having two ends;
   a first oscillator core coupled to a first end of the first slab inductor and a second end of the second slab inductor; and
   a second oscillator core coupled to a second end of the first slab inductor and a first end of the second slab inductor.

2. The integrated voltage controlled oscillator of claim 1 wherein the first slab inductor and the second slab inductor are parallel to each other.

3. The integrated voltage controlled oscillator of claim 1 further comprising:
   a third slab inductor having two ends;
   a third oscillator core coupled to a first end of the third slab inductor and the second end of the second slab inductor; and
   wherein the first oscillator core is coupled to a second end of the third slab inductor and the first end of the first slab inductor.

4. The integrated voltage controlled oscillator of claim 1 further comprising:
   a third slab inductor having two ends;
   a fourth slab inductor having two ends;
   a third oscillator core coupled to a first end of the third slab inductor and the second end of the second slab inductor;
   a fourth oscillator core coupled to a second end of the third slab inductor and a first end of the fourth slab inductor; and
   wherein the first oscillator core is coupled to a second end of the fourth slab inductor and the first end of the first slab inductor.

5. The integrated voltage controlled oscillator of claim 1 wherein the oscillator cores are selected from one or more of the group comprising an NMOS oscillator core, a PMOS oscillator core, a complementary oscillator core, and a noise shifting differential Colpitts oscillator core.

6. The integrated voltage controlled oscillator of claim 4 further comprising a virtual ground coupled to a middle point of each slab inductor.

7. The integrated voltage controlled oscillator of claim 6 wherein the virtual ground comprises a conducting element coupled to the middle point of each slab inductor.

8. The integrated voltage controlled oscillator of claim 4 further comprising a pick-up loop disposed within the four slab inductors, wherein the oscillator signal is induced in the pick-up loop.

9. The integrated voltage controlled oscillator of claim 1 further comprising a first resonant tank capacitor in parallel with the first oscillator core and a second resonant tank capacitor in parallel with the second oscillator core.

10. The integrated voltage controlled oscillator of claim 9 wherein the slab inductors each have a shape selected from one of the group comprising a rectangle, a curve, an "L" shape, and a "U" shape.

11. A method for providing a voltage controlled oscillator signal in an integrated circuit comprising:
 coupling a plurality of oscillator cores via slab inductors that are used to provide a tank resonance inductance for the oscillator cores;
 exciting the oscillator cores at an oscillation frequency; and
 receiving the oscillator signal from a pick-up coil that is inductively coupled to the slab inductors.

12. The method of claim 11 further comprising cross-connecting the slab inductor center points to suppress parasitic modes of oscillation or self-induced dc latching.

13. The method of claim 11 wherein coupling the plurality of oscillator cores via the slab inductors further comprises selecting the oscillator cores from one or more of the group comprising an NMOS oscillator core, a PMOS oscillator core, a complementary oscillator core, and a noise shifting differential Colpitts oscillator core.

14. The method of claim 11 wherein driving the oscillator cores at the oscillation frequency comprises adjusting a voltage level to change the oscillation frequency of the oscillator cores.

15. The method of claim 11 further comprising providing a capacitor in parallel with each oscillator core.

16. The method of claim 15 wherein each capacitor is selected from the group comprising a resonant tank capacitor, a varactor, and a switched capacitor bank.

17. An integrated voltage controlled oscillator comprising:
 two or more slab inductors, each having a first end and a second end;
 two or more oscillator cores coupled to a first end of one of the two or more slab inductors and a second end of another of the slab inductors; and
 wherein the slab inductors and the oscillator cores form a continuous circuit.

18. The integrated voltage controlled oscillator of claim 17 wherein the oscillator cores are selected from one or more of the group comprising an NMOS oscillator core, a PMOS oscillator core, a complementary oscillator core, and a noise shifting differential Colpitts oscillator core.

19. The integrated voltage controlled oscillator of claim 17 further comprising a virtual ground coupled to a middle point of each slab inductor.

20. The integrated voltage controlled oscillator of claim 17 wherein the virtual ground comprises a conducting element coupled to the middle point of each slab inductor.

21. The integrated voltage controlled oscillator of claim 1 further comprising a pick-up loop disposed within the slab inductors, wherein the oscillator signal is induced in the pick-up loop.

22. The integrated voltage controlled oscillator of claim 1 further comprising a resonant tank capacitor in parallel with each oscillator core.

23. The integrated voltage controlled oscillator of claim 1 further comprising one or more resonating tanks inductively coupled to each oscillator.

24. The integrated voltage controlled oscillator of claim 23 wherein the resonating tanks are disposed adjacent to each oscillator.

25. The integrated voltage controlled oscillator of claim 23 wherein the resonating tanks further comprise two or more slab inductors, each having a first end and a second end.

26. The integrated voltage controlled oscillator of claim 23 wherein the resonating tanks further comprise:
 two or more slab inductors, each having a first end and a second end; and
 one or more capacitor in series with the two or more slab inductors.

27. An integrated voltage controlled oscillator system comprising:
 a first voltage controlled oscillator further comprising;
  a first slab inductor having two ends;
  a second slab inductor having two ends; and
  a first oscillator core coupled to a first end of the first slab inductor and a second end of the second slab inductor;
 a second voltage controlled oscillator further comprising:
  a third slab inductor having two ends;
  a fourth slab inductor having two ends; and
  a second oscillator core coupled to a first end of the third slab inductor and a second end of the fourth slab inductor; and
 wherein the first voltage controlled oscillator and the second voltage controlled oscillator are inductively coupled.

28. The integrated voltage controlled oscillator system of claim 27 wherein the first voltage controlled oscillator further comprises a third oscillator core coupled to a second end of the first slab inductor and a first end of the second slab inductor.

29. The integrated voltage controlled oscillator system of claim 27 wherein the slab inductors are L shaped.

30. The integrated voltage controlled oscillator system of claim 27 wherein the slab inductors each further comprise:
 a first straight portion; and
 a second straight portion perpendicular to the first straight portion and coupled to the end of the first straight portion.

* * * * *